(12) United States Patent
Kim

(10) Patent No.: US 11,769,803 B2
(45) Date of Patent: *Sep. 26, 2023

(54) SEMICONDUCTOR DEVICE INCLUDING FIN AND METHOD FOR MANUFACTURING THE SAME

(71) Applicant: Samsung Electronics Co., Ltd., Suwon-si (KR)

(72) Inventor: Sungmin Kim, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/734,457

(22) Filed: May 2, 2022

(65) Prior Publication Data

US 2022/0271129 A1    Aug. 25, 2022

Related U.S. Application Data

(62) Division of application No. 17/068,390, filed on Oct. 12, 2020, now Pat. No. 11,362,183.

(30) Foreign Application Priority Data

Mar. 30, 2020 (KR) .......... 10-2020-0038151

(51) Int. Cl.
*H01L 29/36* (2006.01)
*H01L 29/16* (2006.01)
*H01L 29/78* (2006.01)

(52) U.S. Cl.
CPC .......... *H01L 29/36* (2013.01); *H01L 29/1604* (2013.01); *H01L 29/7851* (2013.01)

(58) Field of Classification Search
CPC . H01L 29/36; H01L 29/1604; H01L 29/7851; H01L 29/7853; H01L 29/66795; H01L 29/785; H01L 29/1033; H01L 29/16; H01L 29/42376

See application file for complete search history.

(56) References Cited

U.S. PATENT DOCUMENTS

| | | |
|---|---|---|
| 8,759,943 B2 | 6/2014 | Tseng et al. |
| 8,796,666 B1 | 8/2014 | Huang et al. |
| 9,536,772 B2 | 1/2017 | Chen et al. |
| 9,882,032 B2 | 1/2018 | Ching et al. |
| 9,978,870 B2 | 5/2018 | Ching et al. |
| 10,026,829 B2 | 7/2018 | Cappellani et al. |
| 10,103,266 B2 | 10/2018 | Kim et al. |
| 10,269,901 B2 | 4/2019 | Ching et al. |
| 10,388,763 B2 | 8/2019 | Chang et al. |
| 10,510,871 B1 | 12/2019 | More et al. |
| 2005/0279992 A1 | 12/2005 | Gupta et al. |
| 2016/0087103 A1 | 3/2016 | Ching et al. |
| 2018/0233415 A1 | 8/2018 | Pandey et al. |
| 2019/0157160 A1 | 5/2019 | Lu et al. |

*Primary Examiner* — Syed I Gheyas

(74) *Attorney, Agent, or Firm* — Harness, Dickey & Pierce, P.L.C.

(57) ABSTRACT

A semiconductor device includes a substrate; and a fin protruding from the substrate. The fin includes a first material and a second material. The fin includes a lower section, a middle section, and an upper section. The middle section has a smaller width at a middle portion than a width at lower and upper portions of the middle section. A concentration of the second material gradually decreases from the middle portion in upward and downward directions.

20 Claims, 9 Drawing Sheets

SEMICONDUCTOR DEVICE INCLUDING FIN AND METHOD FOR MANUFACTURING THE SAME

CROSS-REFERENCE TO THE RELATED APPLICATION

This application is a divisional of U.S. application Ser. No. 17/068,390, filed Oct. 12, 2020, which claims priority from Korean Patent Application No. 10-2020-0038151, filed on Mar. 30, 2020, in the Korean Intellectual Property Office, the disclosure of each of which is incorporated herein by reference in its entirety.

BACKGROUND

1. Field

Example embodiments of the disclosure relate to a semiconductor device including a fin and/or a method for manufacturing the same.

2. Description of Related Art

Conventional methods in which a silicon germanium (SiGe) layer is directly etched to form a fin including silicon germanium may damage a channel region of the fin. The damage may be due to a wet annealing process in a process of forming a shallow trench isolation (STI) structure.

SUMMARY

Some example embodiments of the disclosure provide a fin including silicon germanium (SiGe) formed using a process of diffusing germanium (Ge) in silicon (Si).

A semiconductor device according to an embodiment of the disclosure may include a substrate, and a fin protruding from the substrate. The fin may include a first material and a second material. The fin may include a lower section, a middle section, and an upper section. The middle section may have a smaller width at a middle portion of the middle section than a width at a lower portion of the middle section and a width at an upper portion of the middle section. A concentration of the second material may gradually decrease from the middle portion in an upward direction and a downward direction.

A semiconductor device according to an embodiment of the disclosure may include a substrate and a fin protruding from the substrate, the fin including a first material and a second material, an isolation layer disposed on side surfaces of the fin, and a gate structure extending from the isolation layer in a direction crossing the fin, wherein the fin includes a side surface recessed at a lower level than an upper surface of the isolation layer, and a notch formed at a higher level than the upper surface of the isolation layer, and wherein the second material has a concentration gradient in a direction perpendicular to an upper surface of the substrate.

A semiconductor device according to an embodiment of the disclosure may include a substrate, a lower fin protruding from the substrate, an upper fin vertically spaced from the lower fin, an oxide layer disposed between the lower fin and the upper fin, and a gate structure extending from the lower fin in a direction crossing the lower fin, wherein each of the lower fin and the upper fin includes a first material and a second material, and a concentration of the second material gradually increases in the lower fin in an upward direction while gradually decreasing in the upper fin in an upward direction.

A semiconductor device according to an embodiment of the disclosure may include a substrate, a fin protruding from the substrate and extending horizontally, an isolation layer covering side surfaces of a lower portion of the fin, a gate structure extending in a direction crossing the fin, sources/drains at opposite side surfaces of the gate structure, respectively, and an interlayer insulating layer disposed on the sources/drains. The fin may include a first material and a second material. The fin may include a lower section, a middle section, and an upper section. The middle section may include a recessed side surface. The upper section may include a side surface formed with a notch. A width of a middle portion of the middle section may be smaller than a minimum width of the upper section. A concentration of the second material may have a concentration gradient such that the concentration may be maximum at an apex of the recessed side surface of the middle section. The gate structure may include a gate electrode on the fin and the isolation layer, a gate dielectric layer between the fin and the gate electrode, a gate capping layer on the gate electrode, and gate spacers at opposite side surfaces of the gate dielectric layer, respectively.

A method for manufacturing a semiconductor device in accordance with another embodiment of the disclosure may include sequentially forming a first material layer and a second material layer on a substrate, forming a fin structure on the substrate, forming an isolation layer to cover side surfaces of the fin structure, and performing an annealing process on the fin structure. The fin structure may include a lower pattern, a middle pattern, and an upper pattern. The annealing process may form a fin including a recessed side surface while forming a concentration gradient of the second material in the fin. The second material may have a concentration gradually decreasing from a middle portion of the recessed side surface in an upward direction and a downward direction.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
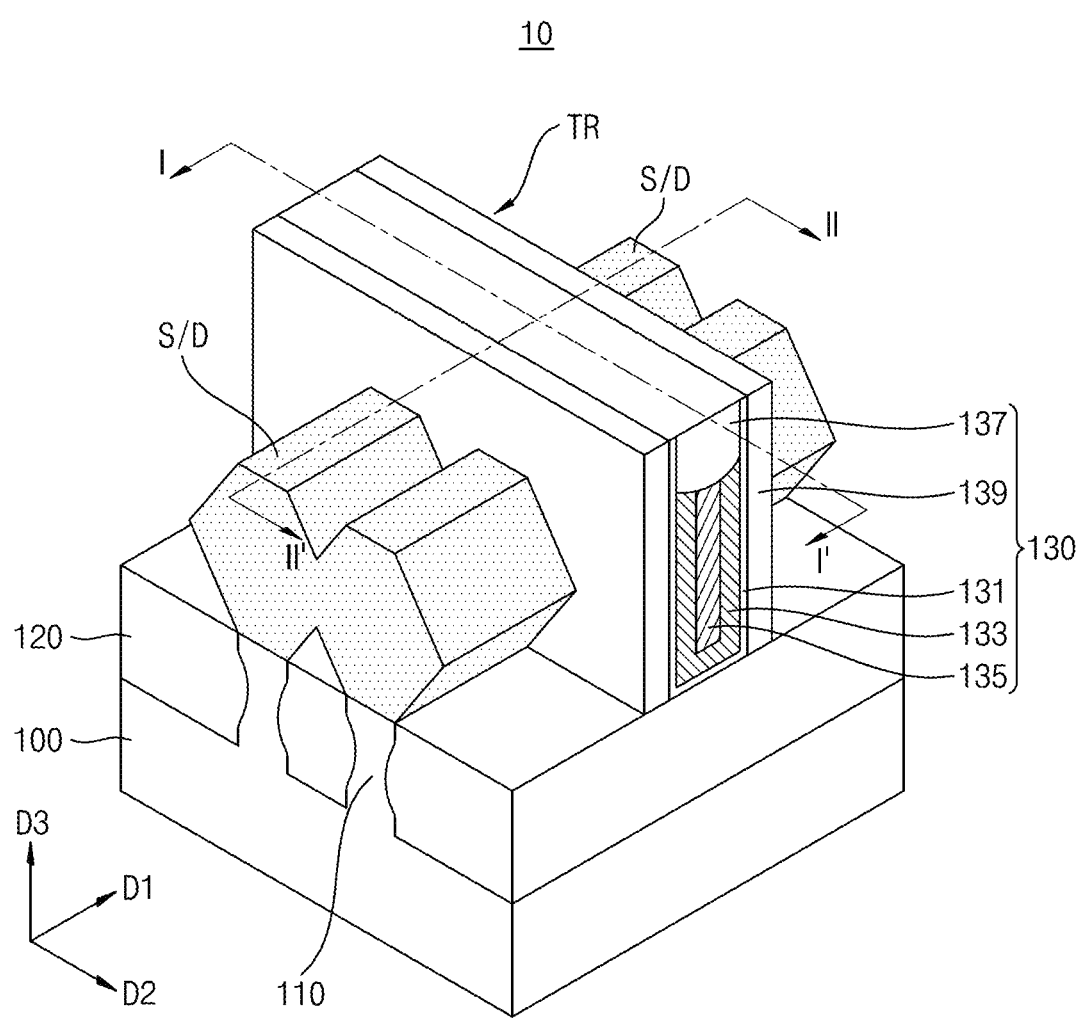
FIG. 1 is a schematic perspective view of a semiconductor device according to an example embodiment of the disclosure.
Figure 2:
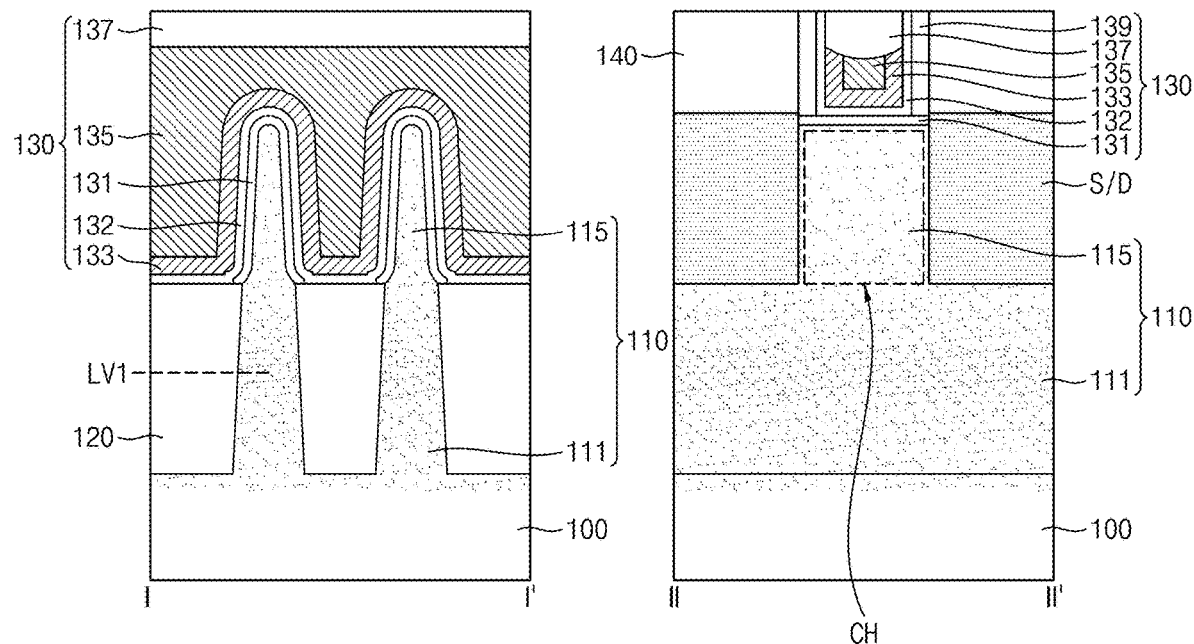
FIG. 2 is a cross-sectional view taken along lines 1-I' and II-II' in FIG. 1.

FIG. 1 is a schematic perspective view of a semiconductor device according to an example embodiment of the disclosure. FIG. 2 is a cross-sectional view taken along lines 1-I' and II-II' in FIG. 1.

Referring to FIGS. 1 and 2, the semiconductor device, which is designated by reference numeral "10", may include a substrate 100, a fin 110, an isolation layer 120, a gate structure 130, and sources/drains S/D.

The substrate 100 may be a semiconductor substrate or a compound semiconductor substrate including silicon, germanium, silicon-germanium, etc. For example, the substrate 100 may be a silicon substrate.

The fin 110 may have a fin shape protruding from the substrate 100 while extending lengthwise in one direction. For example, the fin 110 may include a longer side extending in a first direction D1 and a shorter side extending in a second direction D2 crossing the first direction D1, and may protrude in a third direction D3 perpendicular to an upper surface of the substrate 100.

The fin 110 may be a portion of the substrate 100, and may include an epitaxial layer grown from the substrate 100. The fin 110 may include a first material and a second material. For example, the first material may be silicon (Si), and the second material may be germanium (Ge) or carbon (C). When a channel region CH in the fin 100 includes the second material, mobility of carriers in the channel region CH may be enhanced. Accordingly, even when the scale of a transistor TR is reduced, mobility of carriers in the channel region CH may be enhanced.

The isolation layer 120 may be disposed at opposite sides of the fin 110. The isolation layer 120 may cover side walls of a lower section 111 of the fin 110 while exposing an upper section 115 of the fin 110. That is, the upper section 115 of the fin 110 may protrude upwards from an upper surface of the isolation layer 120.

The gate structure 130 may be disposed on the substrate 100 and the isolation layer 120 while crossing the fin 110. For example, the gate structure 130 may extend in the second direction D2. The gate structure 130 may include a gate dielectric layer 131-132, a gate electrode 133-135, a gate capping layer 137, and gate spacers 139. The gate structure 130 as described above may be formed through, for example, a replacement process.

The gate electrode 133-135 may include a plurality of gate metal layers. For example, the gate electrode 133-135 may include a first gate metal layer 133 and a second gate metal layer 135. The second gate metal layer 135 may be disposed on the first gate metal layer 133. The first gate metal layer 133 may surround lower and side surfaces of the second gate metal layer 135. For example, the first gate metal layer 133 may include at least one of TiAl, TiAlC, TiAlN, HfSi, TiN, TaN, TiC, or TaC. In addition, the second gate metal layer 135 may include W or Al.

The gate dielectric layer 131-132 may be disposed between the fin 110 and the gate electrode 133-135. The gate dielectric layer 131-132 may include an interface layer 131 and a gate insulating layer 132. The interface layer 131 may cover a surface of the upper section 115 of the fin 110 protruding from the isolation layer 120 while extending the profile of the upper section 115 of the fin 110. For example, the interface layer 131 may include silicon oxide. In an embodiment, when the interface layer 131 and the fin 100 have different physical properties, the interface layer 131 may cover the upper surface of the isolation layer 120 while extending between the gate dielectric layer 131-132 and the isolation layer 120. For example, the interface layer 131 may include silicon oxide, silicon nitride, silicon oxynitride, gallium oxide, or germanium oxide. The interface layer 131 may be formed through oxidation of a portion of the fin 110. Alternatively, the interface layer 131 may be formed through atomic layer deposition (ALD), chemical vapor deposition (CVD), or physical vapor deposition (PVD). In an embodiment, the interface layer 131 may be omitted.

The gate dielectric layer 131-132 may be disposed between the fin 110 and the gate electrode 133-135 and on the isolation layer 120. The gate dielectric layer 131-132 may cover a surface of the interface layer 131 and the upper surface of the isolation layer 120. The gate dielectric layer 131-132 may extend along the profile of the upper section 115 of the fin 110 protruding from the isolation layer 120. When the interface layer 131 is omitted, the gate dielectric layer 131-132 may cover the isolation layer 120 and the surface of the upper section 115 of the fin 110 protruding from the isolation layer 120. The gate dielectric layer 131-132 may surround a lower surface and opposite side surfaces of the gate metal layer 133 while extending in the third direction D3 along inner surfaces of the gate spacers 139.

The gate dielectric layer 131-132 may include at least one of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The gate capping layer 137 may be disposed on the gate dielectric layer 131-132, the first gate metal layer 133, and the second gate metal layer 135. For example, the gate capping layer 137 may include silicon nitride or silicon oxynitride.

The gate spacers 139 may be disposed at opposite side surfaces of the gate dielectric layer 131-132 and the gate capping layer 137, respectively. The gate spacers 139 may insulate the sources/drains S/D and the gate electrode 133-135 from each other. For example, the gate spacers 139 may include at least one of silicon nitride (SiN), silicon oxynitride (SiON), silicon oxide ($SiO_2$), silicon oxycarbonitride (SiOCN), or a combination thereof. The gate spacers 139 may be constituted by a multilayer film.

The sources/drains S/D may be disposed at opposite side surfaces of the gate structure 130 on the fin 110, respectively. Each source/drain S/D may be provided as a source or a drain of the semiconductor device 10. A peripheral surface of each source/drain S/D may have various shapes such as a polygonal shape, a circular shape, and a rectangular shape. For example, each source/drain S/D may include SiGe and/or SiC.

An interlayer insulating layer 140 may cover the isolation layer 120, the sources/drains S/D, and the gate structure 130. For example, the interlayer insulating layer 140 may include at least one of silicon oxide, silicon nitride, silicon oxynitride, or a low dielectric material having lower permittivity than silicon oxide.

Referring to FIG. 2, the second material included in the fin may have a concentration gradient. The second material may have a concentration varying in accordance with a position thereof in the fin 110.

In an embodiment, the second material included in the fin 110 may have a concentration gradient in a direction perpendicular to an upper surface of the substrate 100. The concentration of the second material included in the fin 110 has a maximum value at a desired (and/or alternatively predetermined) level LV1 between the upper surface of the substrate 100 and the upper surface of the isolation layer 120, and may gradually decrease from the desired (and/or alternatively predetermined) level LV1 toward an upper portion of the fin 110. In addition, the concentration of the second material may gradually decrease from the desired (and/or alternatively predetermined) level LV1 toward a lower portion of the fin 110. That is, the concentration of the second material may be further lowered at a position vertically farther from the desired (and/or alternatively predetermined) level LV1

For example, the desired (and/or alternatively predetermined) level LV1 may be an approximately middle (½) point between the upper surface of the substrate 100 and the upper surface of the isolation layer 120 in a direction perpendicular to the upper surface of the substrate 100. The maximum concentration of the second material in the fin 110 may be about 20% (e.g., in a range of about 18% to 22%, but not limited thereto).

Figure 3:
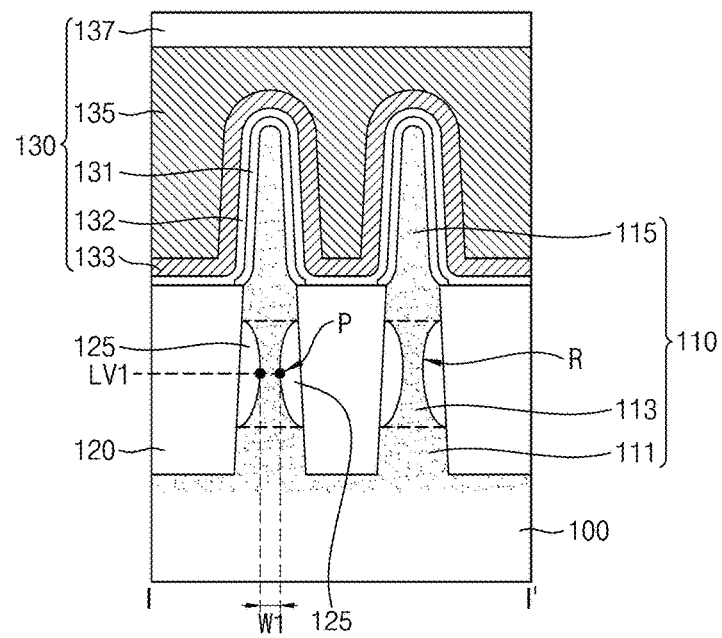
FIGS. 3 to 5 are cross-sectional views taken along line I-I' in FIG. 1, respectively.
Figure 4:
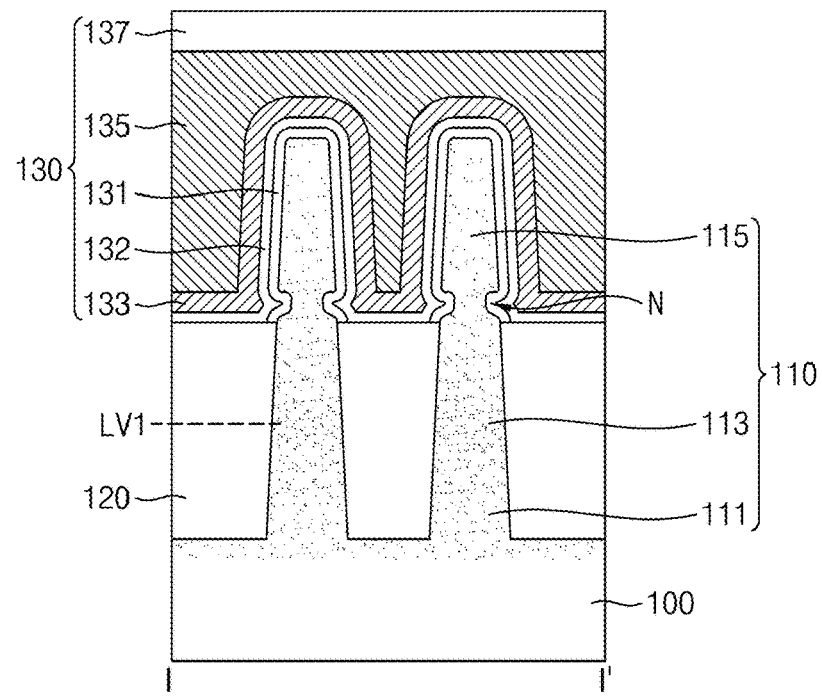
Figure 5:
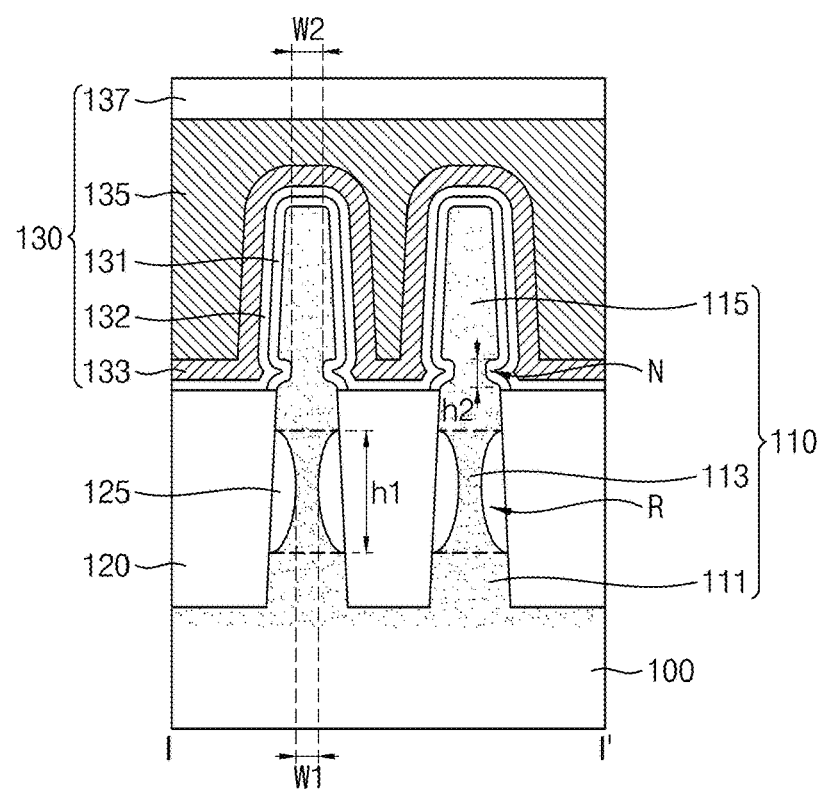

FIGS. 3 to 5 are cross-sectional views taken along line I-I' in FIG. 1, respectively.

Referring to FIG. 3, the fin 110 may include the lower section 111, which is disposed on the substrate 100, a middle section 113 disposed on the lower section 111, and the upper section 115, which is disposed on the middle section 113. Oxide layers 125 may be disposed at opposite side surfaces of the middle section 113, respectively. The lower section 111 and the middle section 113 may be disposed below the upper surface of the isolation layer 120. The upper section 115 may be disposed on the upper surface of the isolation layer 120 while having a portion disposed below the upper surface of the isolation layer 120.

The middle section 113 may have side surfaces R recessed to be concave in an inward direction of the middle section 113. Accordingly, a middle portion of the middle section 113 may have a smaller width than upper and lower portions of the middle section 113. The middle section 113 has a horizontal width gradually decreasing from the lower portion of the middle section 113 toward the middle portion of the middle section 113 while gradually increasing from the middle portion of the middle section 113 toward the upper portion of the middle section 113. For example, the middle section 113 may have a minimum width W1 at a level LV1 corresponding to an apex P of each recessed side surface R. The middle section 113 may have a maximum width at an upper and/or a lower end of the middle section 113. For example, the horizontal width of the upper end of the middle section 113 may be equal to or smaller than the horizontal width of the lower end of the middle section 113.

The lower section 111 may extend from the upper surface of the substrate 100 such that the lower section 111 is connected to the lower end of the middle section 113. The horizontal width of the lower section 111 may gradually decrease from the upper surface of the substrate 100 toward the middle section 113. The upper section 115 may extend from the upper end of the middle section 113 such that the upper section 115 protrudes from the isolation layer 120. The horizontal width of the upper section 115 may gradually decrease from a lower portion of the upper section 115 toward an upper portion of the upper section 115.

In an embodiment, the concentration of the second material may be higher than in the middle section 113 than in the lower section 111. In addition, the concentration of the second material may be higher in the middle section 113 than in the upper section 115.

The second material may have different concentration gradients in the lower section 111, the middle section 113 and the upper section 115. The concentration of the second material in the lower section 111 may gradually increase from the lower portion of the lower section 111 toward the upper portion of the lower section 111. That is, the concentration of the second material in the lower section 111 may be minimum at a lower end of the lower section 111 while being maximum at an upper end of the lower section 111.

The concentration of the second material in the middle section 113 may gradually increase from the lower portion of the middle section 113 toward the middle portion of the middle section 113, and may then gradually decrease from the middle portion of the middle section 113 toward the upper end of the middle section 113. That is, the concentration of the second material in the middle section 113 may gradually decrease from the middle portion of the middle section 113 in an upward direction and in a downward direction. The concentration of the second material in the middle section 113 may be maximum in the middle portion of the middle section 113. For example, the concentration of the second material in the middle section 113 may be maximum at the level LV1 where the horizontal width of the middle section 113 is smallest. For example, the concentration of the second material in the middle section 113 may be maximum at a level corresponding to the apex P of each recessed side surface R of the middle section 113.

The concentration of the second material in the upper section 115 may gradually decrease from the lower portion of the upper section 115 toward the upper portion of the upper section 115. The concentration of the second material in the upper section 115 may be maximum at a lower end of the upper section 115 while being minimum at an upper end of the upper section 115.

The oxide layers 125 may be disposed between the middle section 113 and respective isolation layers 120. The oxide layers 125 may cover the opposite recessed side surfaces of the middle section 113, respectively. The oxide layers 125 may include a material different from a material included in the isolation layers 120. For example, the oxide layers 125 may include germanium (Ge) or carbon (C). The oxide layers 125 including the second material may apply stress to the channel region of the fin 110 and, as such, may enhance mobility of carriers.

Referring to FIG. 4, the fin 110 may include a notch N formed at each side surface of the fin 110. The notch N may be disposed on the upper surface of the isolation layer 120. The fin 110 may have a smallest width at a portion thereof where the notch N is formed.

Referring to FIG. 5, the middle section 113 of the fin 110 may include recessed side surfaces R, and the upper section 115 of the fin 110 may include a notch N disposed at each recessed side surface R. The upper section 115 may have a minimum width W2 at a portion thereof where the notch N is formed. The middle section 113 may have a minimum width W1 smaller than the minimum width W2 of the upper section 115. Each recessed side surface R may have a vertical length h1 greater than a vertical length h2 of the notch N1.

Figure 6:
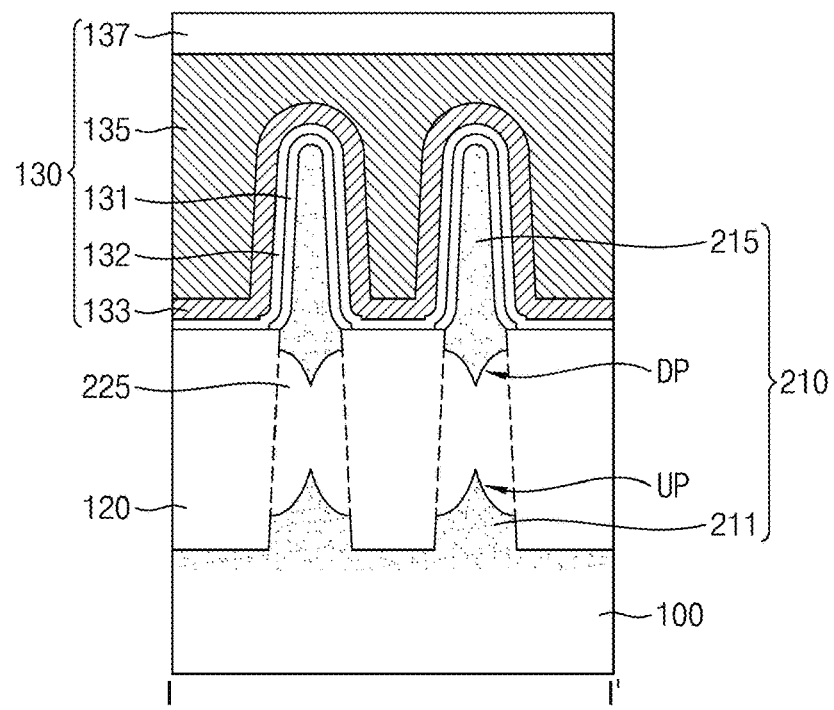
FIGS. 6 and 7 are cross-sectional views taken along line I-I' in FIG. 1.
Figure 7:
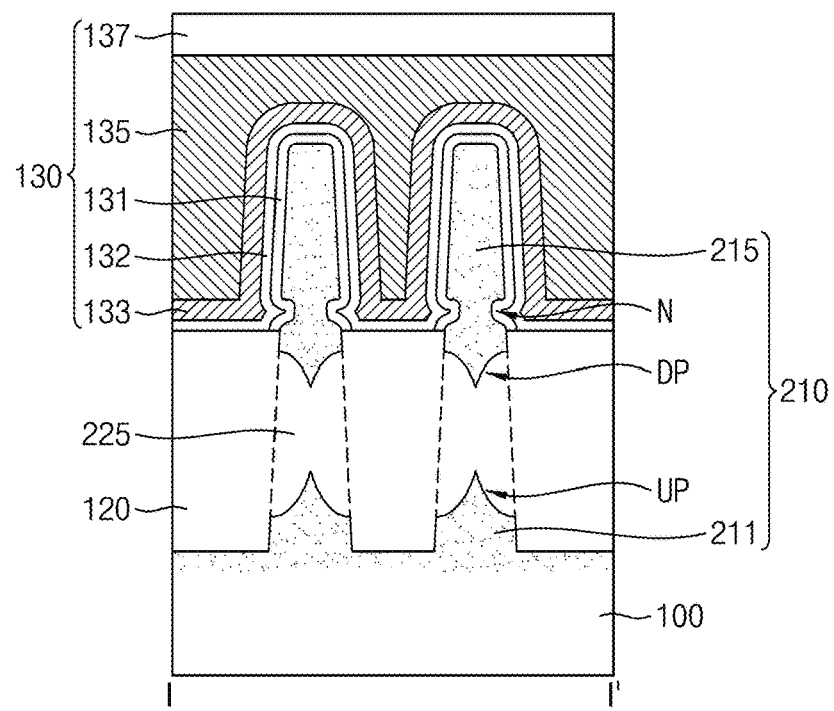

FIGS. 6 and 7 are cross-sectional views taken along line I-I' in FIG. 1.

Referring to FIG. 6, the semiconductor device may include a lower fin 221, an upper fin 215, and an oxide layer 225. The lower fin 211 may protrude from the upper surface of the substrate 100, and may include an upper edge UP disposed at an upper portion of the lower fin 211 while having a tapered shape. The upper fin 215 may be disposed to be vertically spaced apart from the lower fin 211, and may include a lower edge DP disposed at a lower portion of the upper fin 215 while having a taper shape. The lower edge DP and the upper edge UP may have symmetrical shapes, respectively.

The oxide layer 225 may be disposed between the upper fin 215 and the lower fin 211. The oxide layer 225 may be disposed between isolation layers 120 horizontally spaced apart from each other. The oxide layer 225 may include the second material. For example, the oxide layer 225 may include SiGeO or SiCO.

Each of the lower fin 211 and the upper fin 215 may include the first material and the second material. For example, the first material may be silicon (Si), and the second material may be germanium (Ge) or carbon (C). In an embodiment, the second material of the lower fin 211 and the second material of the upper fin 215 may have different concentration gradients in a direction perpendicular to the upper surface of the substrate 100. The concentration of the second material in the lower fin 211 may gradually increase from a lower portion of the lower fin 211 toward the upper portion of the lower fin 211. The concentration of the second material in the upper fin 215 may gradually decrease from the lower portion of the upper fin 215 toward an upper portion of the upper fin 215. For example, the concentration of the second material in the upper fin 215 may be maximum at the lower edge DP. The concentration of the second material in the lower fin 211 may be maximum at the upper edge UP. In an embodiment, the concentration of the second material at the lower edge DP in the upper fin 215 and the concentration of the second material at the upper edge UP in the lower fin 211 may be substantially equal.

In an embodiment, the second material in the oxide layer 225 may have a concentration gradient. For example, the concentration of the second material of the oxide layer 225 may be maximum in a middle portion of the oxide layer 225, and may gradually decrease from the middle portion of the oxide layer 225 in an upward direction or in a downward direction. In an embodiment, the concentration of the second material in the oxide layer 225 may be uniform. The oxide layer 225 including the second material may apply stress to a channel region of the upper fin 215 and, as such, may enhance mobility of carriers.

Referring to FIG. 7, the upper fin 215 may include notches N. The notches N may be formed at opposite side surfaces of the upper fin 215 on upper surfaces of the isolation layers 120, respectively.

FIGS. 8 to 17 illustrate schematic process flow views explaining a method for manufacturing a semiconductor device in accordance with an example embodiment of the disclosure.

Figure 8:
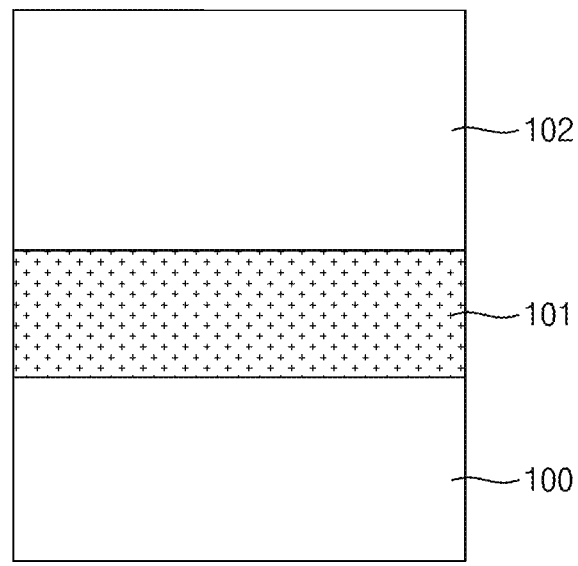
FIGS. 8 to 17 illustrate schematic process flow views explaining a method for manufacturing a semiconductor device in accordance with an example embodiment of the disclosure.

Referring to FIG. 8, the method may include sequentially forming a first material layer 101 including a first material and a second material layer 102 including a second material on a substrate 100.

The substrate 100 may be a silicon substrate. The first material may be silicon germanium (SiGe) or silicon carbide (SiC). The second material may be silicon (Si). The first material layer 101 may be formed using an epitaxial growth method.

Figure 9:
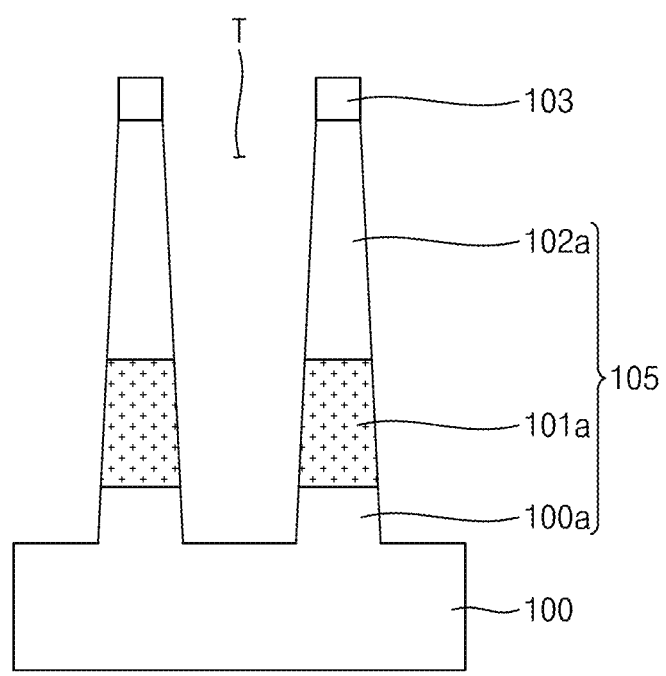

Referring to FIG. 9, the method may include forming a fin 110 on the substrate 100. Forming the fin 110 may include forming a mask pattern 103 on the second material layer 102, and etching the second material layer 102, the first material layer 101, and the substrate 100 using the mask pattern 103, thereby forming a fin structure 105 and a trench T defining the fin structure 105. The fin structure 105 formed through the etching process may include a lower pattern 100*a*, a middle pattern 101*a*, and an upper pattern 102*a* sequentially stacked on the substrate 100. The upper pattern 102*a* is formed through etching of the second material layer 102, the middle pattern 101*a* may be formed through etching of the first material layer 101, and the lower pattern 100*a* may be formed through etching of a portion of the substrate 100.

Figure 10:
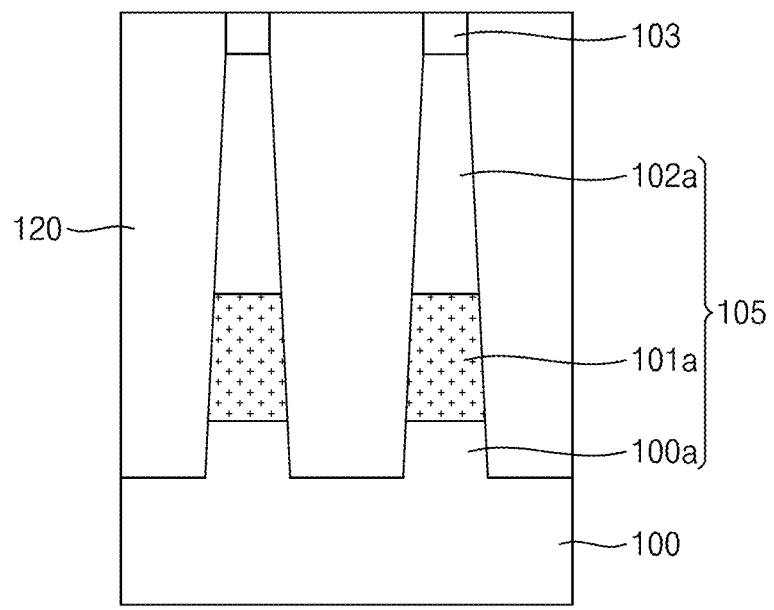

Referring to FIG. 10, the method may include forming an isolation layer 120 in the trench T. Forming the isolation layer 120 may include forming an insulator in the trench T, and performing a low-temperature annealing process. The low-temperature annealing process is performed in an atmosphere including oxygen, and may also be performed at 500° C. or more (e.g., in a range of 500° C. to 750° C.). For example, the low-temperature annealing process may be performed at 550° C. for 30 minutes. The isolation layer 120 may be formed to cover at least a portion of each side surface of the fin 110. The isolation layer 120 may be formed to completely cover side surfaces of the middle pattern 101*a*. The isolation layer 120 may include an oxide.

Figure 11:
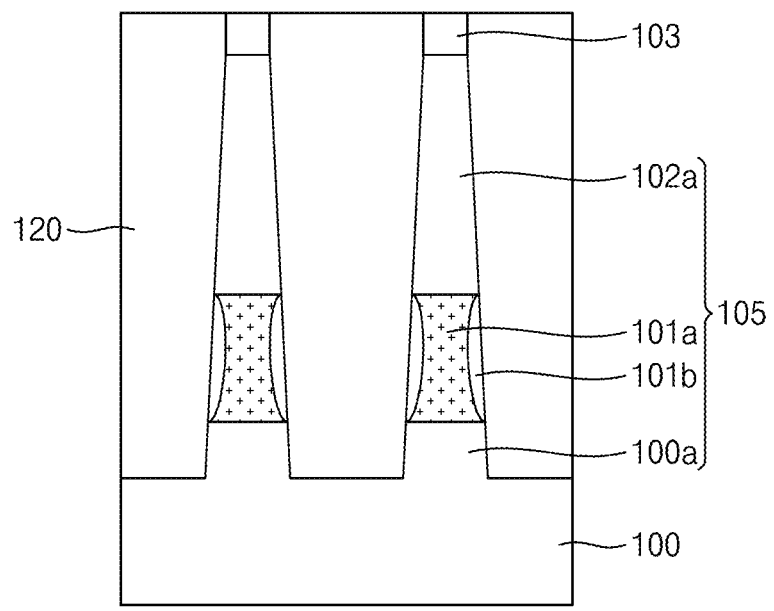

Referring to FIG. 11, the method may include recessing at least a portion of each side surface of the fin structure 105 to be concave. Recessing at least a portion of each side surface of the fin structure 105 to be concave may include partially oxidizing the middle pattern 101*a*. As a thermal treatment process is performed in a wet oxidation environment separately from the low-temperature annealing process forming the isolation layer 120, the middle pattern 101*a* is partially oxidized, thereby forming oxide layers 101*b*. As such, side surfaces of the middle pattern 101*a* contacting the isolation layer 120 may be recessed to be concave. Since the middle pattern 101*a* includes silicon germanium (SiGe), the upper pattern 102*a* and the lower pattern 100*a* include silicon (Si), and silicon germanium (SiGe) and silicon (Si) have different oxidation rates, it may be possible to oxidize only the middle pattern 101*a* by utilizing the oxidation rate difference.

In an embodiment, recessing at least a portion of each side surface of the fin structure 105 to be concave may be achieved by partially oxidizing a middle section 113 of the fin structure 105 through the low-temperature annealing process performed at 500° C. in the atmosphere including oxygen, as described in conjunction with FIG. 10, without a separate oxidation process as shown in FIG. 11. Of course, an oxide layer formed through the low-temperature annealing process may be formed to have a smaller thickness than an oxide layer formed through the oxidation process performed in the wet environment described in conjunction with FIG. 11.

In an embodiment, in the method, the side surfaces of the fin structure 105 may be recessed through the low-temperature annealing process for forming the isolation layer 120, as described in conjunction with FIG. 10, and may be additionally recessed through the thermal treatment process subsequently performed in the wet oxidation environment.

Figure 12:
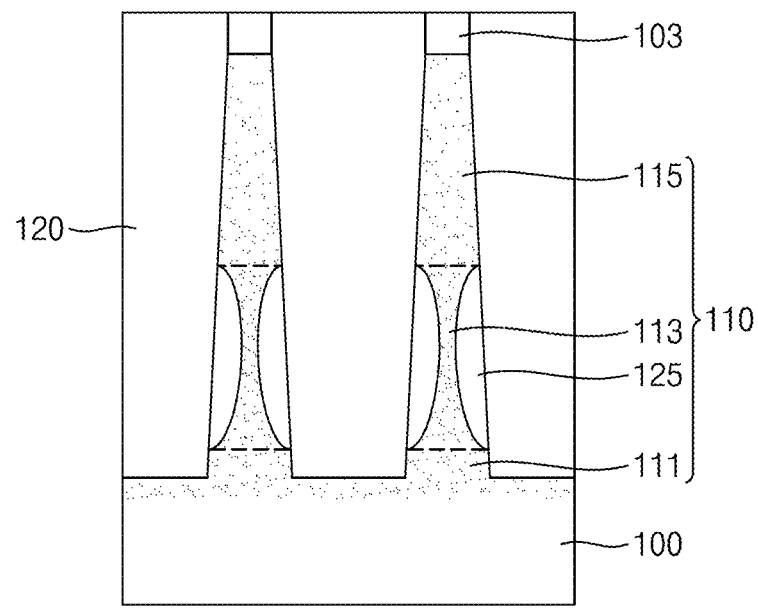

Referring to FIG. 12, the method may include diffusing the first material included in the middle pattern 101*a* into the lower pattern 100*a* and the upper pattern 102*a*, thereby forming a concentration gradient of the first material in the fin 110. Diffusion of the first material may include performing a high-temperature annealing process. The high-temperature annealing process may be performed at 800° C. or more (e.g., in a range of 800° C. to 1200° C.). For example, the high-temperature annealing process may be performed at 1,050° C. for 30 minutes. For example, the high-temperature annealing process may be a laser annealing process. The first material included in the middle pattern 101a may be diffused toward the upper pattern 102a and the lower pattern 100a through the high-temperature annealing process. In accordance with diffusion of the first material in the fin 110 in upward and downward directions, the concentration of the first material may be maximum at a position corresponding to a middle portion of the middle pattern 101a, and may gradually decrease from the middle portion in upward and downward directions.

The middle pattern 101a may be additionally oxidized through the high-temperature annealing process for diffusion of the first material. In addition, the upper pattern 102a and the lower pattern 100a, which include the first material as the first material is diffused into the upper pattern 102a and the lower pattern 100a through the high-temperature annealing process, may be partially oxidized. As a result, a middle section 113, a lower section 111, and an upper section 115 may be formed. In addition, the oxide layer 125 may have an increased width and an increased length. The middle section 113 may have a smaller width than the middle pattern 101a (FIG. 11) having the recessed side surfaces, and may have a greater vertical length than the middle pattern 101a. The vertical length of the middle section 113 may be about 30 nm or more.

In an embodiment, the middle section 113 may be oxidized through the high-temperature annealing process and, as such, may be separated into an upper fin and a lower fin, as described in conjunction with FIGS. 6 and 7.

Figure 13:
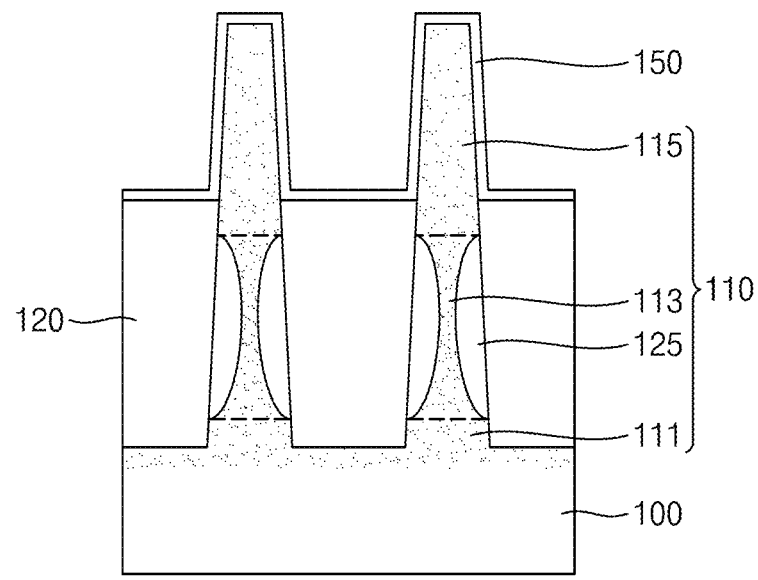

Referring to FIG. 13, the method may include exposing an upper portion of the fin 110, and forming a liner layer 150 on the isolation layer 120 and the exposed fin 110. Exposure of the upper portion of the fin 110 may include partially removing the isolation layer 120. Even after the upper portion of the fin 110 is exposed through partial removal of the isolation layer 120, the upper surface of the isolation layer 120 may be disposed above an upper end of the middle section 113. The liner layer 150 may be formed along the profile of the upper section 115 of the fin 110 protruding from the isolation layer 120, and may cover the upper surface of the isolation layer 120. The liner layer 150 may be formed through ALD, CVD, or PVD. For example, the liner layer 150 may include amorphous silicon.

In an embodiment, performing the high-temperature annealing process as described in conjunction with FIG. 12 may be executed after exposure of the upper portion of the fin 110 through partial removal of the isolation layer 120.

Figure 14:
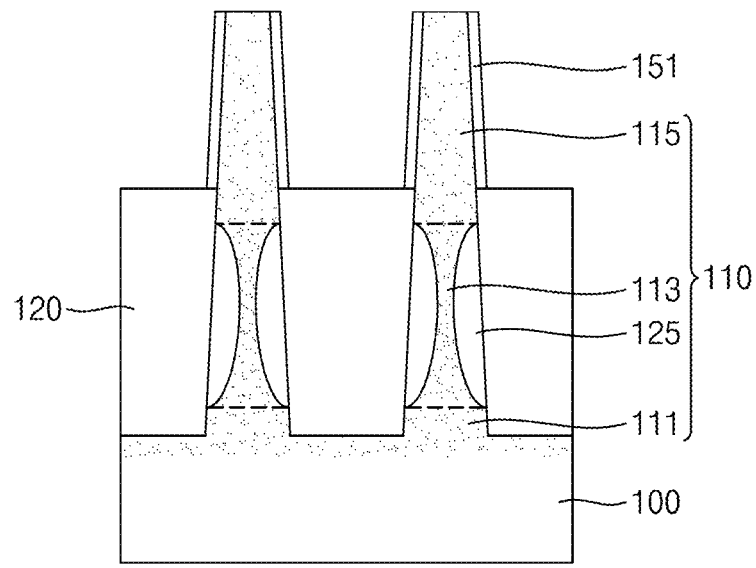

Referring to FIG. 14, the method may include partially etching the liner layer 150, thereby forming a liner pattern 151. As the liner layer 150 is partially removed, the upper surface of the fin 110 and the upper surface of the isolation layer 120 may be exposed, and the liner pattern may be formed 151. The liner pattern 151 may cover opposite side surfaces of the fin 110 exposed from the isolation layer 120.

Figure 15:
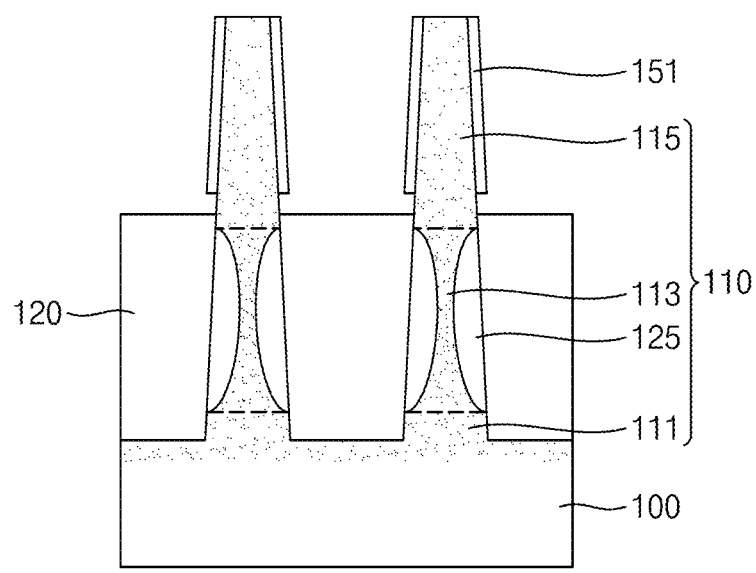

Referring to FIG. 15, the method may include partially etching the isolation layer 120 through an etch-back process, thereby exposing side surfaces of the fin 110. The etch-back process may include an anisotropic etching process. As the isolation layer 120 is partially removed, the upper surface of the isolation layer 120 may be formed below the liner pattern 151. Of course, even after partial removal of the isolation layer 120, the upper surface of the isolation layer 120 may be disposed above the upper end of the middle section 113. As the isolation layer 120 is partially removed, the side surfaces of the fin 110 may be partially exposed between the liner pattern 151 and the isolation layer 120.

Figure 16:
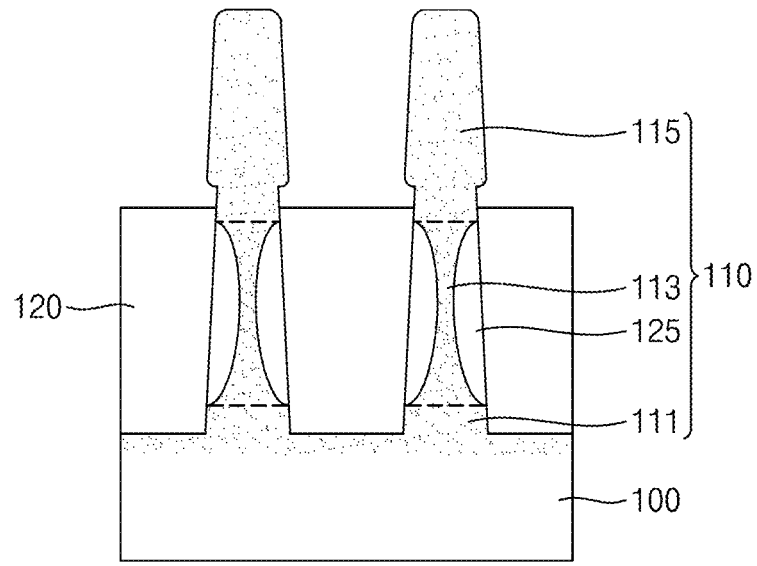

Referring to FIG. 16, the method may include crystallizing the liner pattern 151 through an annealing process (also referred to as an annealing operation). As the liner pattern 151 is crystallized through the annealing process, the upper section of the fin 110 may be expanded. During the annealing process, the first material included in the fin 110 may be diffused into the liner pattern 151. Accordingly, the first material may also be included in a portion of the upper section of the fin 110, which is formed in accordance with crystallization of the liner pattern 151 through the annealing process.

Figure 17:
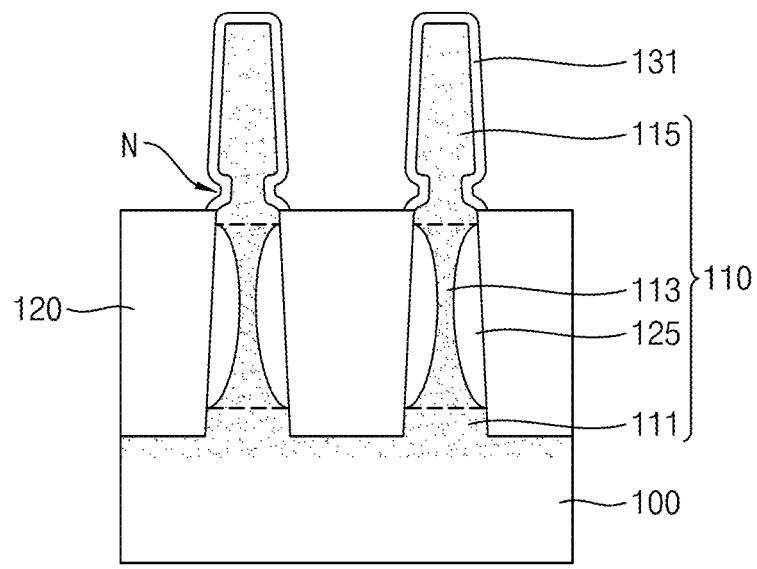

Referring to FIG. 17, the method may further include partially oxidizing the exposed fin 110, thereby forming an interface layer 131 and notches N. Edge portions of the fin 110 may be rounded through a process for partially oxidizing the fin 110.

Thereafter, a process for forming sources/drains S/D, a gate structure 130, and an interlayer insulating layer 140 is performed and, as such, a transistor TR described in conjunction with each of FIGS. 1 to 7 may be formed.

In accordance with embodiments of the disclosure, a fin including silicon germanium (SiGe) may be formed through a process for diffusing germanium (Ge) into silicon (Si) and, as such, no damage to a channel region of the fin may occur even in a wet annealing process for shallow trench isolation (STI). In addition, the fin including germanium (Ge), which is formed through an epitaxial growth method, is partially oxidized in an isolation layer and, as such, it may be possible to improve isolation characteristics between channel regions, and to enhance carrier mobility of each channel region. Furthermore, notches may be formed at an upper portion of the fin to increase driving current of the transistor and, as such, an improvement in short channel effect may be achieved.

While some embodiments of inventive concepts have been described with reference to the accompanying drawings, it should be understood by those skilled in the art that various modifications may be made without departing from the scope of inventive concepts and without changing features, aspects, and effects thereof. Therefore, the above-described embodiments should be considered in a descriptive sense only and not for purposes of limitation.

What is claimed is:

1. A method for manufacturing a semiconductor device comprising:
    forming a fin structure including a lower pattern, a middle pattern, and an upper pattern on a substrate, the middle pattern including a first material and the upper pattern including a second material;
    performing an annealing process on the fin structure, the annealing process including forming a fin including a recessed side surface while forming a concentration gradient of the first material in the fin,
    forming a liner pattern covering a portion of a side surface of the fin; and
    crystallizing the liner pattern through an annealing operation to expand an upper region of the fin,
    wherein a concentration of the first material gradually decreases from a middle portion of the recessed side surface in upward and downward directions.

2. The method according to claim 1, wherein
    the first material is silicon germanium (SiGe) or silicon carbide (SiC), and
    the second material is silicon (Si).

3. The method according to claim 1, wherein the concentration of the first material is maximum at an apex of the recessed side surface.

4. The method according to claim 1, wherein the forming the fin structure comprises:
sequentially forming a first material layer and a second material layer on the substrate;
forming a mask pattern on the second material layer; and
etching the substrate, the first material layer, and the second material layer using the mask pattern to form a trench defining the fin structure.

5. The method according to claim 4, wherein the forming the fin including the recessed side surface comprises forming an insulating material in the trench and performing a low-temperature annealing process to form an isolation layer and oxidize a portion of the middle pattern.

6. The method according to claim 5, wherein the forming the liner pattern comprises:
partially removing the isolation layer to expose an upper portion of the fin and provide an exposed upper portion of the fin;
forming a liner layer covering an upper surface of the isolation layer and the exposed upper portion of the fin; and
exposing an upper surface of the fin by partially removing the liner layer.

7. The method according to claim 6, wherein the expanding the upper region of the fin comprises partially removing the isolation layer to partially expose the side surface of the fin below a lower end of the liner pattern.

8. The method according to claim 7, further comprising: forming a notch in the side surface of the fin, wherein
the crystallizing the liner pattern through the annealing operation to expand the upper region of the fin provides an expanded upper region of the fin,
the forming the notch comprises forming an interface layer by partially oxidizing the expanded upper region of the fin.

9. The method according to claim 1, wherein the forming the fin including the recessed side surface comprises partially oxidizing the middle pattern by performing a heat treatment process in a wet oxidation environment.

10. The method according to claim 1, wherein the forming the concentration gradient of the first material in the fin comprises performing the annealing process at 800° C. or more and the performing the annealing process includes diffusing the first material included in the middle pattern into the lower pattern and the upper pattern.

11. A method for manufacturing a semiconductor device, comprising:
sequentially forming a first material layer and a second material layer on a substrate;
forming a fin structure on the substrate, the fin structure including a lower pattern, a middle pattern, and an upper pattern;
forming an isolation layer to cover side surfaces of the fin structure; and
performing an annealing process on the fin structure, the annealing process including forming a fin including a recessed side surface while forming a concentration gradient of a first material in the fin,
wherein a concentration of the first material gradually decreases from a middle portion of the recessed side surface in upward and downward directions.

12. The method according to claim 11, wherein the forming the first material layer comprises forming the first material layer using an epitaxial growth method, and
wherein a minimum width of the upper pattern is less than a width of the lower pattern,
the minimum width of the upper pattern is less than a width of an upper portion of the middle pattern, and
the concentration of the first material is maximum at an apex of the recessed side surface of the fin.

13. The method according to claim 11, wherein the forming the fin structure comprises:
forming a mask pattern on the second material layer; and
etching the substrate, the first material layer, and the second material layer using the mask pattern as a mask such that the etching forms a trench that defines the fin structure.

14. The method according to claim 11, wherein the performing the annealing process comprises performing the annealing process at 500° C. or more in an atmosphere including oxygen such that the annealing process forms an oxide layer resulting from partial oxidation of a side surface of the middle pattern.

15. The method according to claim 11, wherein the concentration gradient of the first material in the fin is formed by performing the annealing process at 800° C. or more and the performing the annealing process includes diffusing a second material included in the middle pattern into the lower pattern and the upper pattern.

16. A method for manufacturing a semiconductor device, comprising:
sequentially forming a first material layer and a second material layer on a substrate;
forming a fin structure on the substrate, the fin structure including a lower pattern, a middle pattern, and an upper pattern;
forming an isolation layer to cover side surfaces of the fin structure; and
performing an annealing process on the fin structure, the annealing process including forming a fin including a recessed side surface while forming a concentration gradient of a first material in the fin; and
forming a notch at a side surface of the fin, wherein
a concentration of the first material gradually decreases from a middle portion of the recessed side surface in upward and downward directions.

17. The method according to claim 16, where the forming the notch comprises forming a liner pattern at the side surface of the fin.

18. The method according to claim 17, wherein the forming the liner pattern comprises:
partially removing the isolation layer to expose an upper portion of the fin to provide an exposed upper portion of the fin;
forming a liner layer that covers an upper surface of the isolation layer and the exposed upper portion of the fin; and
partially removing the liner layer to expose an upper surface of the fin.

19. The method according to claim 18, wherein the forming the notch comprises:
partially removing the isolation layer to partially expose the side surface of the fin below a lower end of the liner pattern;
performing an annealing operation, the annealing operation crystallizing the liner pattern; and
partially oxidizing the fin.

20. The method according to claim 18, wherein the liner layer comprises amorphous silicon.

* * * * *